US008104170B2

(12) United States Patent
Morris et al.

(10) Patent No.: US 8,104,170 B2
(45) Date of Patent: Jan. 31, 2012

(54) CHARGE PLATE FABRICATION TECHNIQUE

(75) Inventors: Brian G. Morris, Dayton, OH (US); Richard W. Sexton, Bainbridge, OH (US); Michael F. Baumer, Dayton, OH (US); James E. Harrison, Jr., Dayton, OH (US)

(73) Assignee: Eastman Kodak Company, Rochester, NY (US)

( * ) Notice: Subject to any disclaimer, the term of this patent is extended or adjusted under 35 U.S.C. 154(b) by 783 days.

(21) Appl. No.: 12/020,789

(22) Filed: Jan. 28, 2008

(65) Prior Publication Data

US 2008/0115360 A1 May 22, 2008

Related U.S. Application Data

(62) Division of application No. 10/966,088, filed on Oct. 15, 2004, now abandoned.

(51) Int. Cl.
*H05K 3/02* (2006.01)
*B21D 53/76* (2006.01)

(52) U.S. Cl. ............ 29/846; 29/890.1; 29/842; 347/75; 347/76

(58) Field of Classification Search ................ 29/890.1, 29/842, 830, 846; 347/76, 75; 427/353
See application file for complete search history.

(56) References Cited

U.S. PATENT DOCUMENTS

| | | | | |
|---|---|---|---|---|
| 4,101,906 | A | 7/1978 | Dahlstrom et al. | |
| 4,223,321 | A * | 9/1980 | Kenworthy | 347/76 |
| 4,251,820 | A | 2/1981 | Humenik | |
| 4,530,029 | A | 7/1985 | Beristain | |
| 4,568,946 | A | 2/1986 | Weinberg | |
| 5,512,117 | A | 4/1996 | Morris | |
| 6,274,057 | B1 | 8/2001 | Sexton et al. | |
| 6,478,413 | B1 * | 11/2002 | Motegi et al. | 347/76 |
| 6,543,885 | B2 | 4/2003 | Bahl et al. | |
| 2002/0147319 | A1 * | 10/2002 | Pease et al. | 427/353 X |

FOREIGN PATENT DOCUMENTS

| | | |
|---|---|---|
| EP | 0 613 778 | 7/1994 |
| EP | 0 744 291 | 7/2000 |
| EP | 0 744 290 | 7/2001 |
| EP | 1 396 342 | 3/2004 |
| JP | 5-50607 | 3/1993 |
| JP | 07241990 A * | 9/1995 |

* cited by examiner

*Primary Examiner* — A. Dexter Tugbang
(74) *Attorney, Agent, or Firm* — William R. Zimmerli

(57) ABSTRACT

A charge plate and a method for fabricating a charge plate for an ink jet printhead includes the steps of removing portions of conductive material from a dimensionally stable substrate with a coating of conductive material to form at least a first and second electrode on a first face with a first space between the first and second electrodes, removing portions of conductive material from the dimensionally stable substrate with a coating of conductive material to form a first electrode extension which engages the first electrode on the conductive charging face, and a second electrode extension which engages the second electrode on the conductive charging face, whereby the first and second electrode extensions are electrically isolated from each other, additionally forming a first space between the electrode extensions, which connects with the first space between the electrode extensions.

17 Claims, 3 Drawing Sheets

CHARGE PLATE FABRICATION TECHNIQUE

CROSS REFERENCE TO RELATED APPLICATION

This is a divisional of application Ser. No. 10/966,088 filed Oct. 15, 2004 now abandoned.

FIELD OF THE INVENTION

The present embodiments relate to a method for making a charge plate for use on ink jet printheads having drop generators, orifice plates and charge plates.

The present embodiments relate to the charge plates used in ink jet printheads that comprise drop generators, orifice plates forming a jet array and a charge plate disposed opposite the charge plate.

BACKGROUND OF THE INVENTION

Current charge plate fabrication techniques are limited in the number of lines and spaces that can fit in a linear dimension. For example, current charge plates are typically made with 300-lines per inch resolution. Although higher resolutions can be achieved with these techniques, the higher resolutions come at great cost for development and eventual product yield is slower. A need has existed for a charge plate with a high resolution that can be made inexpensively.

Thin film structures for charge plates have the advantage of extremely high resolution (smaller line widths and spaces) and high yields. The disadvantage of fabricating a charge plate from thin film processes is that the thin film technique has been unsuccessful in providing an electrode structure that extends to the edge and over the charging face of the charge plate.

The main difficulty in defining electrodes that continue from a top surface to an edge surface lies in the difficulty of photo imaging the pattern. Typically, spun liquid photoresist tends to "ball up" along an edge giving rise to a thicker cross-sectional area. Since the amount of photo energy needed to expose the photoresist layer properly is dependent on the thickness of the photoresist layer, the balling up effect causes unacceptable results because consistency cannot be assured.

Another difficulty with thin film processes arises is attempting to expose a second surface after a first surface has already been exposed. Exposing the second surface has traditionally caused a detriment to the previously exposed material.

Other thin film techniques exist to form electrodes that "go around the edge." For example, a shadow mask can be constructed out of wire or out of an L-shaped part with grooves and touch one side and edge to be patterned. After the shadow mask is constructed, sputtering or evaporation of the remaining side can be patterned and etched.

Accordingly, a need exists for a technique that creates extremely high resolution (smaller line widths and spaces) and high product yields in a cost effective manner.

The present embodiments described herein were designed to meet these needs.

SUMMARY OF THE INVENTION

The invention relates to a method for fabricating a charge plate for an ink jet printhead, wherein the method includes the steps of removing portions of conductive material from a dimensionally stable substrate with a coating of conductive material using ablation to form at least a first electrode and a second electrode on a first conductive face with a first space between the first electrode and second electrode. The dimensionally stable substrate with a coating of conductive material has a first conductive edge between the first conductive face and a conductive charging face The method also includes the steps of removing portions of conductive material from the dimensionally stable substrate with a coating of conductive material to form a first electrode extension which engages the first electrode on the conductive charging face, and a second electrode extension which engages the second electrode on the conductive charging face. The first and second electrode extensions are electrically isolated from each other, additionally forming a first space between the electrode extensions wherein the first space connects with the first space between the electrode extensions forming a charge plate.

The invention also relates to a charge plate for an ink jet printhead, which includes a first electrode and a second electrode on a first face with a first space formed between the first and second electrodes on a dimensionally stable non conductive substrate with a continuous conductive coating. The dimensionally stable non conductive substrate with a continuous conductive coating has a first edge between the first face and a charging face. A first electrode extension on the charging face engages the first electrode and a second electrode extension on the charging face engages the second electrode. The first electrode extension is electrically isolated from the second electrode extension and the first space extends to separate the first and second electrode extensions on the charging face.

BRIEF DESCRIPTION OF THE DRAWINGS

In the detailed description of the preferred embodiments presented below, reference is made to the accompanying drawings, in which.

Figure 1:
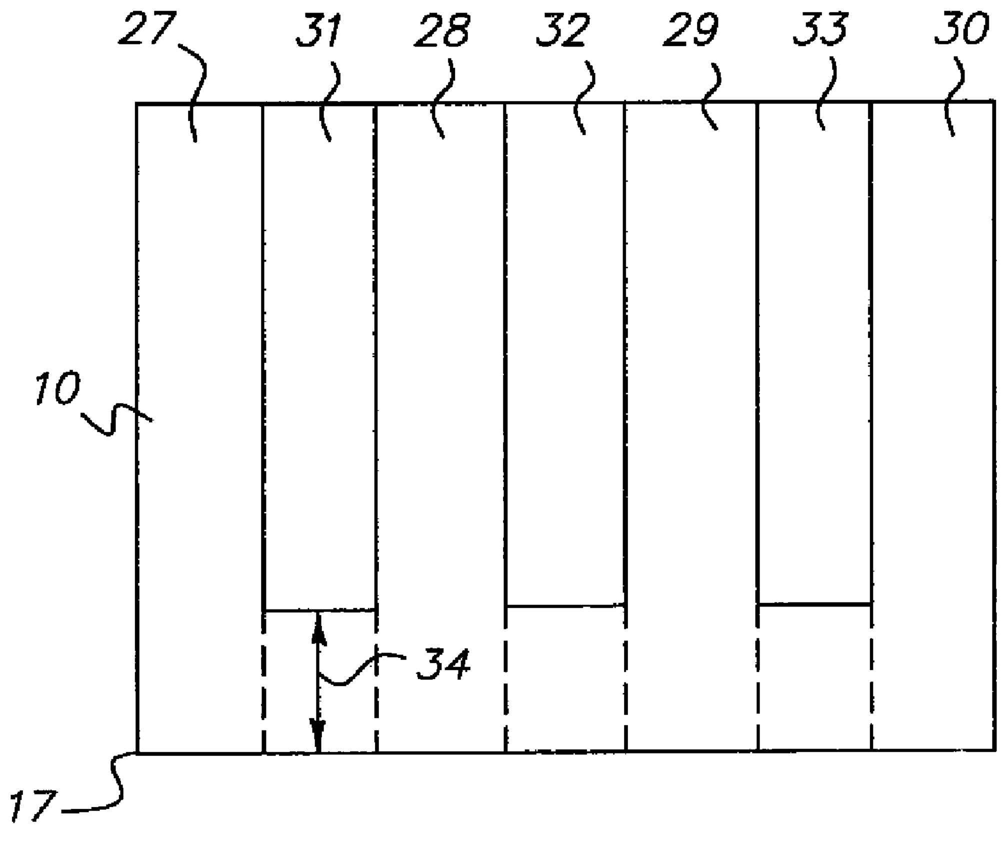
FIG. 1 depicts a top view of the substrate with four electrodes disposed on the first face.

The present embodiments are detailed below with reference to the listed Figures.

DETAILED DESCRIPTION OF THE INVENTION

Before explaining the present embodiments in detail, it is to be understood that the embodiments are not limited to the particular descriptions and that it can be practiced or carried out in various ways.

The embodied methods and charge plate are subject to fewer electrical shortings between electrodes as compared to current conventionally available charge plates. The methods provide techniques of manufacture with fewer open circuits on the electrodes, thereby increasing the reliability of the charge plate for use in an ink jet printhead.

The methods herein were designed to provide techniques of manufacture with fewer steps in order to produce usable charge plates that are more reliable than those formed by current methods. The charge plate is also more durable since electrical shorts will not easily pass through to the electrodes created on the face and charge face of the resulting charge plate.

The embodied methods permit a charge plate to be created with a sharp edge on the charge plate and electrodes that extend across the face and onto the charging face without gaps of currently commercialized techniques, thereby improving printhead quality.

The embodied methods provide environmentally friendly manufacturing processes that do not require the use of large quantities of dangerous chemicals, which can poison the environment. The methods significantly create about half the chemical waste of current manufacturing methods, thereby reducing the amount waste that needs to be disposed of by makers of charge plates for ink jet printheads.

The methods of manufacturing charge plates as described herein are also safer for the employees of the manufacturing process since fewer flammable solvents are used in the process of laser ablation.

The embodied charge plates are more reliable than other systems since the resulting charge plates are less subject to degradation by inks because of the lack of gaps between the electrodes and the electrode extensions. For that same reason, the charge plates provide a higher resistance to erosive chemicals and can be made much thinner than current charge plates using the embodied methods.

The method for fabricating a charge plate for an ink jet printhead includes the step of first removing portions of conductive material from a dimensionally stable dielectric substrate with a coating of conductive material using ablation to form at least a first electrode and a second electrode on a first conductive face with a first space between the first electrode and second electrode. The dimensionally stable substrate with a coating of conductive material has a first conductive edge between the first conductive face and a conductive charging face. Next, portions of conductive material are removed from the dimensionally stable dielectric substrate with a coating of conductive material to form a first electrode extension that engages the first electrode on the conductive charging face. A second electrode extension is formed in conjunction with the first electrode extension. The second electrode extension engages the second electrode on the conductive charging face. The first and second electrode extensions are electrically isolated from each other. A first space is additionally formed between the electrode extensions, wherein the first space connects with the first space between the electrode extensions. The steps of removing the portions of the first face and the charging face can be completed simultaneously.

One or more additional spaces can be formed as each electrode is formed on both the charging face and the first top face of the substrate.

The dimensionally stable dielectric substrate typically is longer than the jet array for the ink jet printhead in order to better control the drops from the inkjet printhead. In a preferred embodiment the dimensionally stable dielectric substrate has a thin rectangular shape with a coating of conductive material. The substrate typically has a width between 1 inch and 6 inches, a length between ¼ inches and 30 inches, and a thickness between 0.004 inch and 0.4 inches. The substrate can be composed of materials such as ceramic, glass, quartz, and composites thereof and combinations thereof.

In an alternative method, a second coating of conductive material can be added on the substrate over a first coating of conductive coating of conductive material. Each coating of conductive material typically has a thickness between 1,000 Angstroms and 10,000 Angstroms. Examples of usable coatings are titanium, gold, platinum, palladium, silver, nickel, tantalum, tungsten alloys, and combinations thereof.

The formed charge plate with electrodes can be coated with a protective dielectric material. Example types of protective dielectric materials include epoxies, polyimides, thick films, thin films, and combinations of these. The films are described below in more detail. The protective dielectric materials can be deposited by screen printing, vapor deposition, chemical deposition, sputtering, or combinations thereof. Portions of the protective dielectric material can be removed from the substrate by laser ablation.

In an alternative to the above methods, a first third face electrode and a second third face electrode can be formed on a third face of the substrate with a fourth space between the first third face electrode and the second third face electrode. A third edge can exist between the third face and the charging face. A non patterned conductive region can be formed between the fourth space and the third edge. A first third face electrode extension can be formed to engage the first third face electrode. A second third face electrode extension can be made in a manner similar to the initial electrode extensions where the electrode extensions engage the respective electrode. The electrode extensions are formed by removing a portion of the continuous conductive coating deposited on the charging face. In conjunction with the electrode extensions, a space is formed on the charging face between the at least two third face electrode extensions. The first third face electrode extension is then electrically isolated from the second third face electrode extension. A portion of the first third face electrode and the second third face electrode can be removed to extend the fourth space to form a continuous connected space with a fifth space on the charging face.

These methods are contemplated to be usable for both continuous ink jet printhead and drop on demand printheads.

The charge plate is formed by the steps of the embodied methods.

Referring now to the figures, FIG. 1 depicts a top view of the charge plate having a first and second electrode 27 and 28 on a first face 10 of a dimensionally stable dielectric substrate with a continuous conductive coating. A first space 31 is created between the first electrode 27 and second electrode 28 by removing, such as by ablating, a portion of the continuous conductive coating. A second space 32 is created between the second electrode 28 and a third electrode 29. A third space 33 is created between the third electrode 29 and a fourth electrode 30. The additional electrodes 28, 29, and 30 are formed by laser ablating or otherwise removing portions of the continuous conductive coating from the substrate.

The first face 10 has a first edge 17. The first edge 17 is preferably a sharp edge sharp, or when coated with the continuous conductive coating, can be beveled. If the first edge 17 is beveled, the first edge 17 typically has a radius of less than 50 microns.

FIG. 1 further depicts a non-patterned conductive region 34 formed between the first space 31 and the first edge 17. The first space 31 extends from the first edge 17 to all additional electrodes formed on the first face 10.

Figure 2:
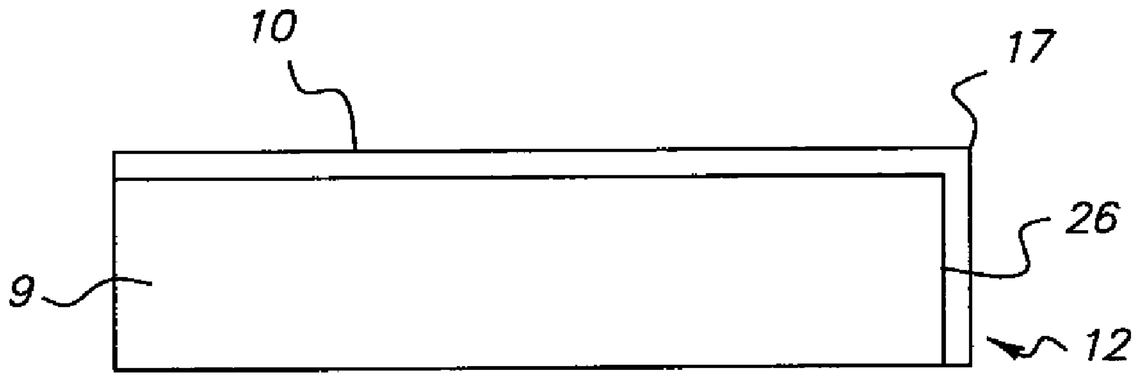
FIG. 2 depicts a cross section of the substrate with the conductive coating disposed on the charging face.

FIG. 2 examples a cross sectional view of the dimensionally stable dielectric substrate 9 with a continuous conductive coating 26. The continuous conductive coating 26 can be a single metal, a first metal on another metal, a conductive layer of a material other than metal or metal alloy, or two or more different conductive layers. The first edge 17 is shown between the first face 10 and a charging face 12. Titanium can be used as a metal with the dual layer conductive coating embodiment. Gold, platinum, palladium, silver, nickel, tantalum, tungsten alloys, or combinations thereof can also be used.

Figure 3:
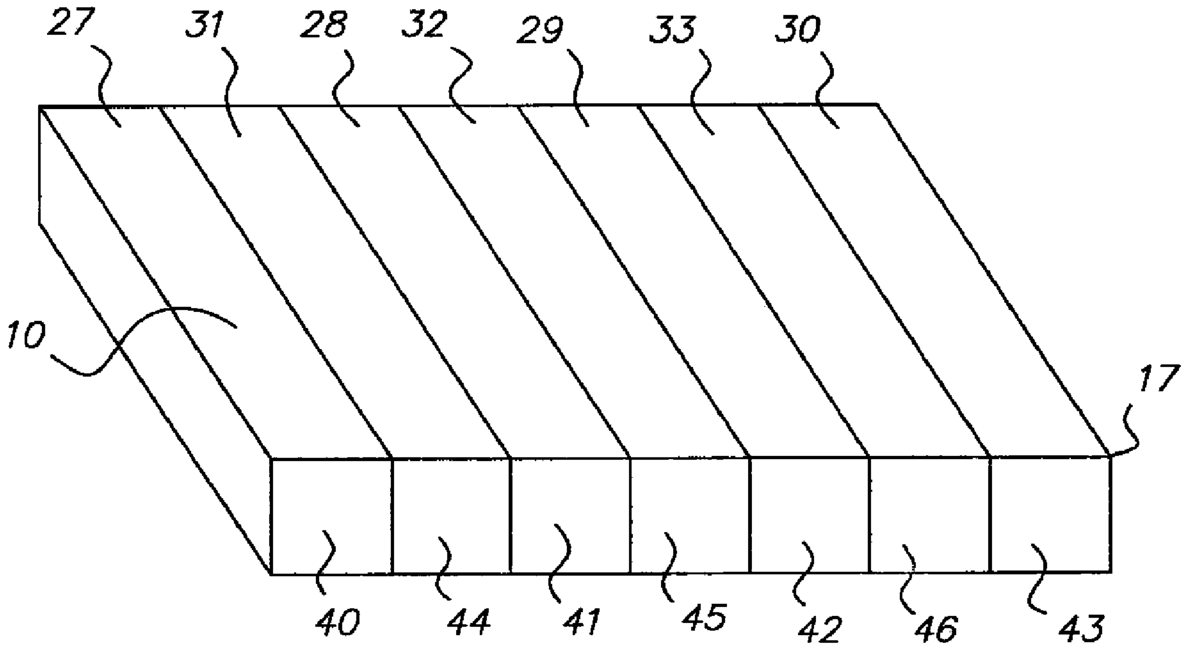
FIG. 3 depicts an isometric view of the substrate with electrodes formed on the first face and the charging face and the spaces and gaps.

FIG. 3 depicts a side view showing the electrodes and electrode extensions that form the charging plate according to the embodied methods. A first electrode 27 and second electrode 28 are formed on the top face 10 of the substrate with a first space 31 is formed between the electrodes. A second space 32 is created between the second electrode 28 and a third electrode 29. A third space 33 is created between the third electrode 29 and a fourth electrode 30. In the embodiment depicted in FIG. 3, the electrodes extend all the way to first edge 17. The first electrode extension 40 on the charging face engages the first electrode 27 and the second electrode extension 41 engages the second electrode 28. Similarly, FIG. 3 shows that third electrode 29 engages a third electrode extension 42 and the fourth electrode 30 engages a fourth electrode extension 43. Any number of electrodes and connected electrode extensions can be formed by these methods.

The spaces formed between the electrodes can be created by removing conductive coating material from the substrate.

Any known method of removing conductive coating material from a substrate can be used, but ablation is the preferred technique. Ablation can be performed using a laser or an electron beam. Ablation can form the spaces, not only between the electrodes on the first side 10, but on the charging face 12 between the electrode extensions.

Continuing with FIG. 3, the first electrode extension 40 is electrically isolated from the second electrode extension 41 with a space 44. The third electrode extension 42 is similarly separated from the second electrode extension 41 by a space 45. The third electrode extension 42 is separated from the fourth electrode extension by another space 46.

Figure 4:
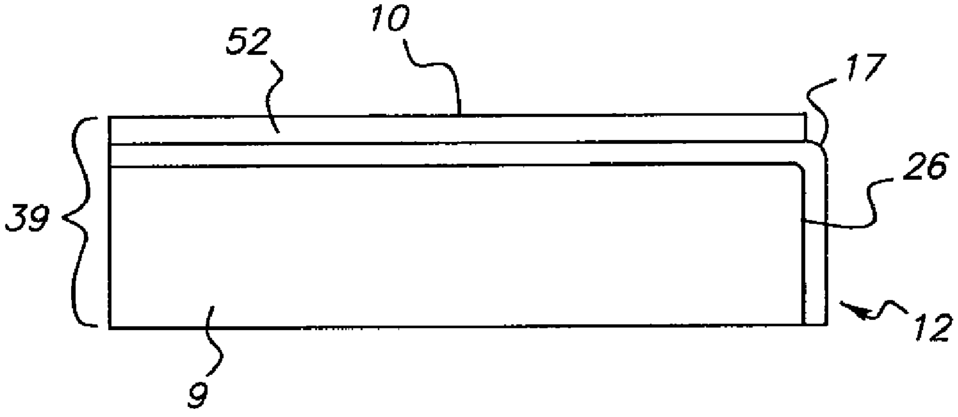
FIG. 4 depicts a detailed cross section of a second embodiment of the first edge.

FIG. 4 shows the substrate 9 with the continuous conductive coating 26 to form the charging plate 39. The top side 10 has a protective dielectric coating 52 disposed over the conductive coating, while the protective dielectric coating 52 does not cover the coating used to form the charging face 12. The protective dielectric material 52 can be an epoxy, such as Epotek 353ND from Epotek Technology of Billerica, Mass.; a polyimide, such as Kapton™ from DuPont of Wilmington, Del.; a thick film, such as the 5704 dielectric film from DuPont of Wilmington, Del.; or a thin film, such as silicon nitride, silicon carbide, aluminum oxide, or parylene from Union Carbide of Danbury, Conn. The protective dielectric material 52 can be a combination of these materials. The protective dielectric material 52 can be deposited by screen printing, vapor deposition, chemical deposition, sputtering, or combinations of these techniques.

Figure 5:
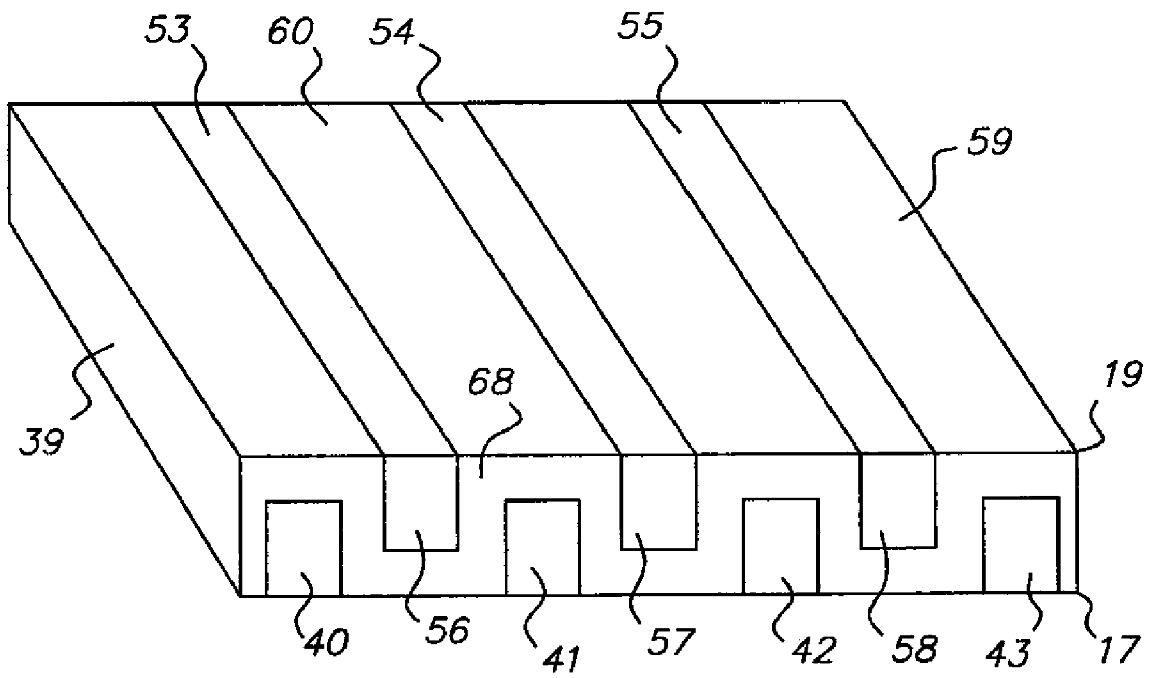
FIG. 5 depicts an isometric view of the third side of the charging plate made according to one embodiment of the invention.

FIG. 5 depicts an isometric bottom view of an embodiment of the charging plate 39. In the embodiment depicted, the device includes a first third face electrode 53 and a second third face electrode 54 formed on a third face 59. A fourth space 60 is between the first third face electrode 53 and the second third face electrode 54. A conductive region is between the fourth space 60 and the third edge 19. Additional electrodes are formed by removing portions of the conductive coating as described in the embodied methods. A first third face electrode extension 56 is formed where the first third face electrode extension 56 engages the first third face electrode 53. A second third face electrode extension 57 engages the second third face electrode 54. A third third face electrode extension 58 engages the third third face electrode 55. A fifth space 68 on the charging face is between the third face electrode extensions 54 and 57. The first third face electrode extension 57 is electrically isolated from the second third face electrode extension 54. A fourth space 60 forms a continuous connected space with the fifth space 68 on the charging face.

The electrodes of the top face and the third face can have an alternative arrangement so that the corresponding electrode extensions alternate on the charging face. In another embodiment, the electrodes and corresponding electrode extensions can be grouped in alternating groups of electrodes, such as three electrodes and electrode extensions on the charging face from the top side and the three electrodes and electrode extensions onto the charging face form the third side.

The embodiments have been described in detail with particular reference to certain preferred embodiments thereof, but it will be understood that variations and modifications can be effected within the scope of the embodiments, especially to those skilled in the art.

PARTS LIST

9 dimensionally stable dielectric substrate
10 first face
12 charging face
17 first edge
19 third edge
26 continuous conductive coating
27 first electrode
28 second electrode
29 third electrode
30 fourth electrode
31 first space
32 second space
33 third space
34 non patterned conductive region
39 charge plate
40 first electrode extension
41 second electrode extension
42 third electrode extension
43 fourth electrode extension
44 first space on the charging face
45 second space on the charging face
46 third space on the charging face
47 second gap
52 protective dielectric material
53 first third face electrode
54 second third face electrode
55 third third face electrode
56 first third face electrode extension
57 second third face electrode extension
58 third third face electrode extension
59 third face
60 fourth space
68 fifth space

The invention claimed is:

1. A method for fabricating a charge plate for an ink jet printhead, wherein the method comprises the steps of:

providing a dimensionally stable dielectric substrate, the dimensionally stable dielectric substrate including a coating of conductive material on a first conductive face, a charging face, a third face, and a first edge located between the first conductive face and the charging face;

removing portions of the conductive material coating from the dimensionally stable dielectric substrate using ablation to form at least a first electrode and a second electrode on the first conductive face with a first space between the first electrode and second electrode;

removing portions of the conductive material coating from the dimensionally stable dielectric substrate to form a first electrode extension on the charging face which engages the first electrode and form a second electrode extension on the charging face which engages the second electrode, the first and second electrode extensions being electrically isolated from each other;

forming a first third face electrode and a second third face electrode on the third face with a fourth space between the first third face electrode and the second third face electrode on the dimensionally stable dielectric substrate and forming a third edge between the third face and the charging face by removing a portion of the conductive material coating deposited on the third face forming a fourth space, and wherein a non patterned conductive region is formed between the fourth space and the third edge;

forming on the charging face a first third face electrode extension which engages the first third face electrode and a second third face electrode extension which engages the second third face electrode by removing a portion of the continuous conductive coating deposited on the charging face to form a fifth space on the charging face between the at least two third face electrode extensions, and wherein the first third face electrode extension is electrically isolated from the second third face electrode extension; and removing a portion of the first third face electrode and the second third face electrode to extend the fourth space to form a continuous connected space with fifth space on the charging face.

2. The method of claim 1, further comprising the step of forming at least one additional space as at least one additional electrode is formed on both faces.

3. The method of claim 1, further comprising the step of coating the first face of the charge plate with a protective dielectric material.

4. The method of claim 3, wherein the protective dielectric material is a member of one of: an epoxy, a polyimide, a thick film, a thin film and combinations thereof.

5. The method of claim 3, wherein the protective dielectric material can be deposited by screen printing, vapor deposition, chemical deposition, sputtering, or combinations thereof.

6. The method of claim 1 wherein the steps for removing the portions of the conductive material coating of the first conductive face and the charging face are simultaneously performed.

7. The method of claim 1, wherein the step for removing portions of the conductive material coating from the dimensionally stable dielectric substrate is performed by laser ablation.

8. The method of claim 1, further comprising using a dimensionally stable dielectric substrate which has a length that is slightly longer than the length of a jet array for the ink jet printhead.

9. The method of claim 1, wherein the ink jet printhead is for a continuous ink jet printhead.

10. The method of claim 1, wherein the dimensionally stable dielectric substrate with the coating of conductive material has a thin rectangular shape.

11. The method of claim 1, wherein the dimensionally stable dielectric substrate with the coating of conductive material has a width between 1 inch and 6 inches, a length between ¼ inches and 30 inches, and a thickness between 0.004 inch and 0.4 inch.

12. The method of claim 1, wherein the dimensionally stable dielectric substrate with the coating of conductive material comprises a coating with at least a second conductive coating deposited over a first conductive coating.

13. The method of claim 1, wherein the dimensionally stable dielectric substrate with the coating of conductive material is a ceramic, glass, quartz, or composites thereof.

14. The method of claim 1, wherein the dimensionally stable dielectric substrate with the coating of conductive material comprises a coating with a thickness between 1,000 Angstroms and 10,000 Angstroms.

15. The method of claim 1, wherein the dimensionally stable dielectric substrate with the coating of conductive material comprises a coating of titanium, gold, platinum, palladium, silver, nickel, tantalum, tungsten alloys, or combinations thereof.

16. The method of claim 1, wherein the first edge is beveled.

17. The method of claim 16, wherein the first edge has a radius of less than 50 microns.

* * * * *